United States Patent
Sato

(10) Patent No.: US 7,661,043 B2
(45) Date of Patent: Feb. 9, 2010

(54) TEST APPARATUS, AND METHOD OF MANUFACTURING SEMICONDUCTOR MEMORY

(75) Inventor: Shinya Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 449 days.

(21) Appl. No.: 11/477,245

(22) Filed: Jun. 29, 2006

(65) Prior Publication Data

US 2007/0005286 A1 Jan. 4, 2007

(30) Foreign Application Priority Data

Jul. 4, 2005 (JP) ............... 2005-194704

(51) Int. Cl.
*G11C 29/00* (2006.01)
(52) U.S. Cl. ................. 714/723; 714/719; 365/200
(58) Field of Classification Search ............. 714/3, 714/5, 42, 718, 719, 723, 724; 365/200, 365/201
See application file for complete search history.

(56) References Cited

U.S. PATENT DOCUMENTS

| | | | | |
|---|---|---|---|---|
| 5,127,097 A | * | 6/1992 | Mizuta | 711/168 |
| 6,249,465 B1 | * | 6/2001 | Weiss et al. | 365/200 |
| 6,553,525 B1 | * | 4/2003 | Shephard, III | 714/733 |
| 2001/0052093 A1 | * | 12/2001 | Oshima et al. | 714/719 |
| 2005/0193233 A1 | * | 9/2005 | Magliocco et al. | 714/5 |

* cited by examiner

*Primary Examiner*—Kevin L Ellis
*Assistant Examiner*—Daniel F McMahon
(74) *Attorney, Agent, or Firm*—Osha•Liang LLP

(57) ABSTRACT

A test apparatus includes a pattern memory for storing a test pattern to be inputted to a memory-under-test, an address generating section for sequentially outputting addresses of the memory-under-test into which the test pattern is to be written, a pointer section for sequentially pointing each address of the pattern memory to cause the pattern memory to output the test pattern in synchronism with the address of the memory-under-test outputted out of the address generating section, a bad block memory for storing an address of a bad block of the memory-under-test in advance and a pointer control section for causing the address generating section to output a next address of the memory-under-test while holding the address of the pattern memory outputted out of the pointer section when the address of the memory-under-test generated by the address generating section coincides with any one of addresses stored in the bad block memory.

4 Claims, 4 Drawing Sheets

TEST APPARATUS, AND METHOD OF MANUFACTURING SEMICONDUCTOR MEMORY

CROSS REFERENCE TO RELATED APPLICATION

The present application claims priority from a Japanese Patent Application(s) No. 2005-194704 filed on Jul. 4, 2005, the contents of which are incorporated herein by reference.

BACKGROUND OF THE INVENTION

1. Field of the Invention

The present invention relates to a test apparatus and a manufacturing method of a semiconductor memory. More specifically, the invention relates to a test apparatus for testing a memory-under-test such as a semiconductor memory and a manufacturing method for manufacturing a semiconductor memory into which a predetermined data pattern has been written.

2. Related Art

Conventionally, as an apparatus for testing a memory-under-test such as a semiconductor memory, there has been known an apparatus having means for writing a predetermined pattern into the memory-under-test and means for judging whether or not the pattern has been normally written into the memory-under-test. The memory-under-test has a plurality of storage blocks and the test apparatus judges whether or not each storage block is defect-free for example.

There is also a case when the test apparatus stores data used in a device for mounting the memory-under-test in the memory-under-test in advance. That is, there is a case when data used after shipping is written in advance into the memory-under-test to be shipped. Writing of such data is carried out by using the writing means described above.

As the writing means, the conventional test apparatus has a pattern memory for storing a predetermined pattern and means for generating an address of the pattern memory in which data to be written is stored and an address of the memory-under-test into which the data is to be written. At this time, the generated address of the memory-under-test converted into the address of the pattern memory is used as the address of the pattern memory generated by the address generating means.

However, if there exits a bad block in the memory-under-test, no data can be written into the bad block in storing the shipping pattern to the memory-under-test. The conventional test apparatus generates the address of the memory-under-test by correlating with the address of the pattern memory in one-to-one. Therefore, data corresponding to the bad block in the pattern to be written is written only to the bad block. Accordingly, it has been unable to utilize the data corresponding to the bad block after being written into the memory-under-test.

Therefore, the conventional test apparatus has written the pattern by selecting a memory-under-test having no bad block in advance in writing the shipping pattern into the memory-under-test. However, a yield of the test becomes worse by making such selection. Because a data amount of the pattern to be written has been increasing lately in particular, the yield of the test has worsened very much due to such selection.

SUMMARY OF THE INVENTION

Accordingly, it is an object of the invention to provide a test apparatus and a manufacturing method of a semiconductor memory, which are capable of solving the above-mentioned problems. This object may be achieved through the combination of features described in independent claims of the invention. Dependent claims thereof specify preferable embodiments of the invention.

That is, according to a first aspect of the invention, there is provided a test apparatus for testing a memory-under-test, having a pattern memory for storing a test pattern to be inputted to the memory-under-test, an address generating section for sequentially outputting addresses of the memory-under-test into which the test pattern is to be written, a pointer section for sequentially pointing each address of the pattern memory to cause the pattern memory to output the test pattern in synchronism with the address of the memory-under-test outputted out of the address generating section, a bad block memory for storing an address of a bad block having a defect out of a storage area of the memory-under-test and a pointer control section for causing the address generating section to output a next address of the memory-under-test while holding the address of the pattern memory outputted out of the pointer section when the address of the memory-under-test generated by the address generating section coincides with any one of addresses stored in the bad block memory.

The pattern memory may store a data pattern used in a device for mounting the memory-under-test as the test pattern. The test apparatus may test a plurality of memories-under-test in parallel and may have a plurality of pattern memories, a plurality of pointer sections, a plurality of bad block memories and a plurality of pointer control sections corresponding to the plurality of memories-under-test, the address generating section may generate an address common to the memories-under-test, each one of the bad block memories may store the address of the bad block of the corresponding memory-under-test and each one of the pointer control sections may control the corresponding pointer section independently from each other based on the address stored in the corresponding bad block memory. The address generating section may further generate a random address of the pattern memory, the pointer section may generate a serial address of the pattern memory and the test apparatus may further include a pattern memory address selecting section for selecting either the random address generated by the address generating section or the serial address generated by the pointer section to input to the pattern memory.

The test apparatus may further include a pattern generating section for generating the test pattern and a data selecting section for selecting either the test pattern generated by the pattern generating section or the test pattern outputted out of the pattern memory to input to the memory-under-test.

The test apparatus may further include a judging section for reading data written in each address of the memory-under-test to judge whether a block corresponding to each address is good or bad based on the read data and the bad block memory stores an address of the block judged to be the bad block by the judging section when the data selecting section selects the test pattern from the pattern generating section, the pattern memory may store the data pattern used in the device for mounting the memory-under-test as the test pattern and the data selecting section may select the test pattern outputted out of the pattern memory after when the bad block memory stores the address of the bad block.

According to a second aspect of the invention, there is provided a manufacturing method for manufacturing a semiconductor memory into which a predetermined data pattern is written, having a preparation step of preparing the semiconductor memory, a judging step of judging a bad block that cannot be used out of a storage area of the semiconductor memory and a writing step of writing the predetermined data pattern into an area other than the bad block in the storage area of the semiconductor memory, and the writing step includes a pattern preparing step of storing the data pattern in a pattern memory, an address generating step of sequentially generating addresses of the semiconductor memory into which the data pattern is to be written, a pointer step of generating addresses for sequentially pointing each address of the pattern memory corresponding to the address of the semiconductor memory generated in the address generating step to input to the pattern memory and a pointer control step of changing the address of the semiconductor memory outputted in the address generating step to a next address while holding the address of the pattern memory outputted in the pointer step when the address of the bad block is stored in advance and the address of the semiconductor memory generated in the address generating step coincides with any one of addresses of the bad block.

It is noted that the summary of the invention described above does not necessarily describe all necessary features of the invention. The invention may also be a sub-combination of the features described above.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
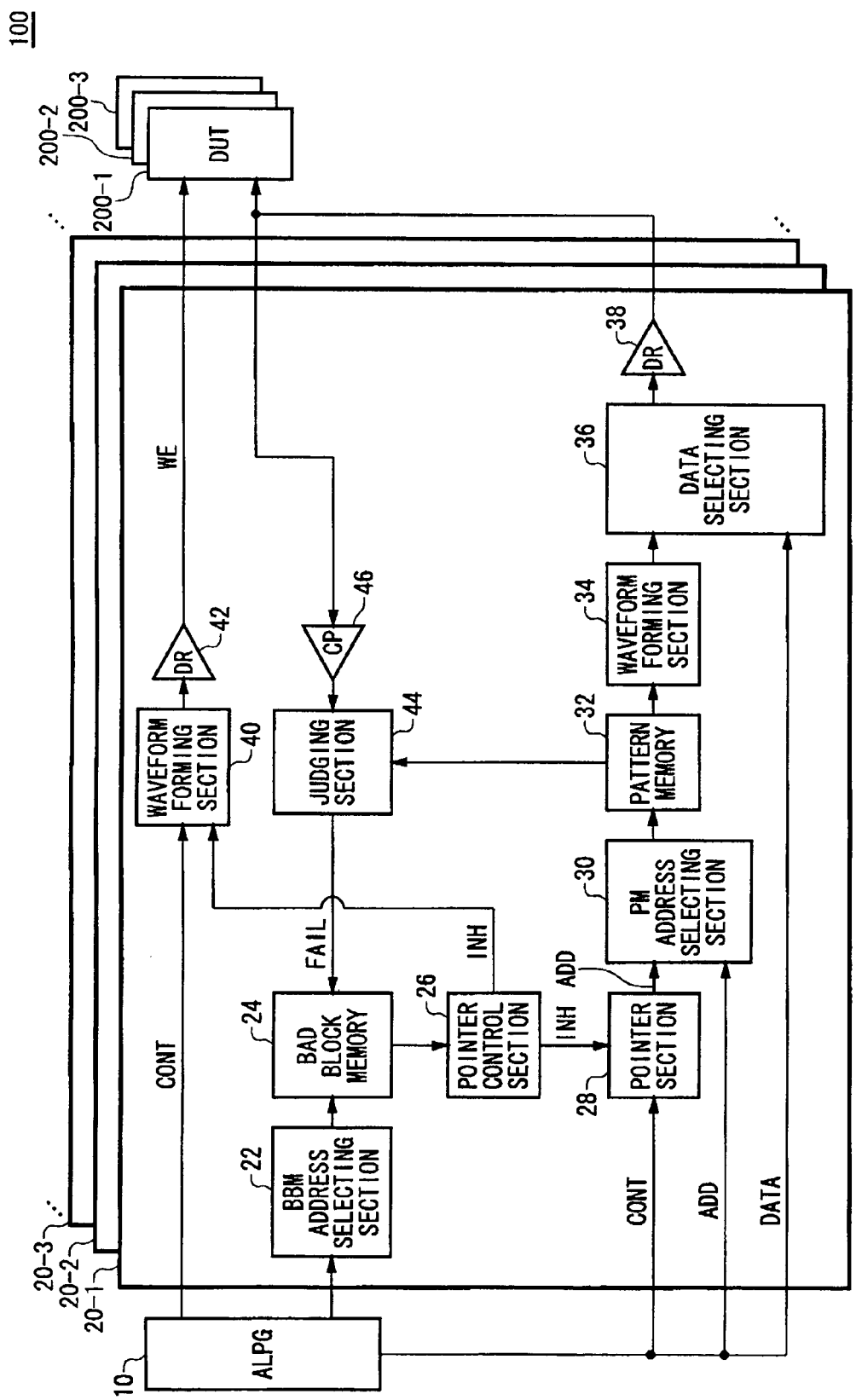
FIG. 1 is a diagram showing one exemplary configuration of a test apparatus 100 according an embodiment of the invention.

FIG. 1 is a diagram showing one exemplary configuration of a test apparatus 100 according an embodiment of the invention. The test apparatus 100 is an apparatus for testing a memory-under-test 200 such as a semiconductor memory and has an algorithm pattern generator (referred to as 'ALPG' hereinafter) 10 and a plurality of test boards 20-1, 20-2, . . . (referred to as 20 in general hereinafter). The plurality of test boards 20 is provided corresponding to a plurality of memories-under-test 200 to be tested. Each test board 20 is connected with the corresponding memory-under-test 200 and writes data into and reads stored data from the corresponding memory-under-test 200.

The ALPG 10 functions as an address generating section for pointing an address into which data is to be written to each memory-under-test 200. The ALPG 10 outputs a same address value to the plurality of test boards 20. That is, the plurality of test boards 20 tests the plurality of memories-under-test 200 in the same time. The ALPG 10 may also generate a signal for controlling each test board 20, data to be written into the memory-under-test 200 and the like and may output them to the test board 20.

Next, each test board 20 will be explained. Each test board 20 has a bad block memory address selecting section (referred to as 'BBM address selecting section hereinafter) 22, a bad block memory 24, a pointer control section 26, a pointer section 28, a pattern memory address selecting section (referred to as 'PM address selecting section') 30, a pattern memory 32, a waveform forming circuit 34, a data selecting section 36, a driver 38, a waveform forming circuit 40, a driver 42, a judging section 44 and a comparator 46.

In the present embodiment, the test apparatus 100 detects a bad block (defective block) in each memory-under-test 200 at first and then writes the shipping pattern to the memory-under-test 200. Here, a storage area of the memory-under-test 200 is divided into a plurality of data blocks in advance. The bad block may be a data block in which one or more cells for example is defective or a data block in which a predetermined number of cells is defective among cells contained in the data block.

In detecting the bad block of the memory-under-test 200, the ALPG 10 sequentially generates and outputs addresses of the memory-under-test 200 into which a test pattern is to be written. The ALPG 10 may also generate the test pattern to be inputted to the memory-under-test 200 and may input it to the memory-under-test 200 via the data selecting section 36 and the driver 38. The ALPG 10 may also input the test pattern stored in the pattern memory 32 in advance to the memory-under-test 200. The addresses, test patterns and the like outputted out of the ALPG 10 are inputted to the respective test boards 20.

The judging section 44 receives data read out of the corresponding memory-under-test 200 via the comparator 46. Then, the judging section 44 judges whether or not each data block in the corresponding memory-under-test 200 is defect-free. For example, the judging section 44 judges whether or not each data block is defect-free by comparing the data inputted to the corresponding memory-under-test 200 with the data read out of the corresponding memory-under-test 200.

The bad block memory 24 stores addresses of the defective bad blocks in the storage area of the corresponding memory-under-test 200. That is, the bad block memory 24 stores '1' as Fail for the data block judged to be defective by the judging section 44. At this time, the bad block memory 24 may receive the address of the data block judged by the judging section 44 from the ALPG 10.

Next, a case of writing the shipping pattern into the memory-under-test 200 will be explained. The pattern memory 32 stores a test pattern corresponding to the shipping pattern in advance. The pattern memory 32 of each test board 20 may store a same test pattern or may store different test patterns. The ALPG 10 sequentially outputs the addresses of the memory-under-test 200 into which the test pattern stored in the pattern memory 32 is to be written. The addresses are inputted to the memory-under-test 200 and the BBM address selecting section 22 of each test board 20.

The pointer section 28 sequentially points each address in the pattern memory 32 so that the pattern memory 32 outputs the test pattern in synchronism with the address of the memory-under-test 200 outputted out of the ALPG 10. For example, the ALPG 10 outputs a control signal for operating the pointer section 28 to the pointer section 28 in the same time when it starts to output the address of the memory-under-test 200. After receiving the control signal, the pointer section 28 outputs the address in the pattern memory 32 by almost same period with period by which the ALPG 10 outputs the address. For example, the pointer section 28 may point the address of the pattern memory 32 by sequentially incrementing it.

Based on the test pattern outputted out of the pattern memory 32, the waveform forming circuit 34 forms a signal to be inputted to the memory-under-test 200 and inputs it to the memory-under-test 200 via the data selecting section 36 and the driver 38. When there is no bad block in the memory-under-test 200, all of the test patterns stored in the pattern memory 32 may be stored in the memory-under-test 200 by the operation described above.

The BBM address selecting section 22 converts the address received from the ALPG 10 into an address for the bad block memory 24. When the address of the memory-under-test 200 outputted out of the ALPG 10 coincides with any one of the addresses of the bad block stored in the bad block memory 24, the pointer control section 26 causes the ALPG 10 to output a next address of the memory-under-test 200 while holding the address outputted out of the pointer section 28. For example, when the address of the memory-under-test 200 outputted out of the ALPG 10 coincides with any one of the addresses of the bad block stored in the bad block memory 24, the pointer control section 26 inhibits the pointer section 28 from incrementing the address. When the address of the memory-under-test 200 outputted out of the ALPG 10 coincides with none of the addresses of the bad block stored in the bad block memory 24, the pointer control section 26 will not inhibit the pointer section 28 from outputting the next address.

Still more, the ALPG 10 supplies a write enable signal for enabling writing of data to the memory-under-test 200 via the waveform forming circuit 40 and the driver 42 in writing data into the memory-under-test 200. When the address of the memory-under-test 200 outputted out of the ALPG 10 coincides with any one of the addresses of the bad block stored in the bad block memory 24 here, the pointer control section 26 inhibits the waveform forming circuit 40 from outputting the write enable signal.

Then, it becomes possible to write data to be written by skipping the bad block in the memory-under-test 200 and by selecting the data block having no defect by controlling the address inputted to the memory-under-test 200 and the address inputted to the pattern memory 32 independently from each as described above. Therefore, all data may be written even into the memory-under-test 200 having the bad block. That is, it is not necessary to select any memory-under-test 200 having no defect in advance and accordingly, the yield of the test may be improved in writing the shipping data thereto.

The ALPG 10 may further generate a random address for randomly pointing the address of the pattern memory. Still more, the pointer section 28 generates a serial address for serially pointing the address of the pattern memory 32. In this case, the random address and the serial address are inputted to the PM address selecting section 30.

In detecting the bad block of the memory-under-test 200, the PM address selecting section 30 selects either the serial address or the random address depending on whether the test pattern stored in the pattern memory 32 in advance is used or the random test pattern is used. The user may set in advance the address to be selected by the PM address selecting section 30.

Such configuration enables the user to select whether the test pattern stored in advance is used or the random test pattern is used in detecting the bad block of the memory-under-test 200. When the pattern memory 32 stores the data pattern used in a device for mounting the memory-under-test 200 as the test pattern for example, the test pattern may be used to generate the random test pattern. The PM address selecting section 30 may select the random address in detecting the bad block of the memory-under-test 200 and may select the serial address in writing the shipping data to the memory-under-test 200.

The ALPG 10 may also function as a pattern generating section for generating the test pattern to be inputted to the memory-under-test 200 in detecting the bad block of the memory-under-test 200. The data selecting section 36 selects either the test pattern generated by the ALPG 10 or the test pattern outputted out of the pattern memory 32 and inputs it to the memory-under-test 200. For example, the data selecting section 36 may select the test pattern received from the ALPG 10 in detecting the bad block of the memory-under-test 200 and may select the test pattern received from the pattern memory 32 in writing the shipping data into the memory-under-test 200 for example.

Figure 2:
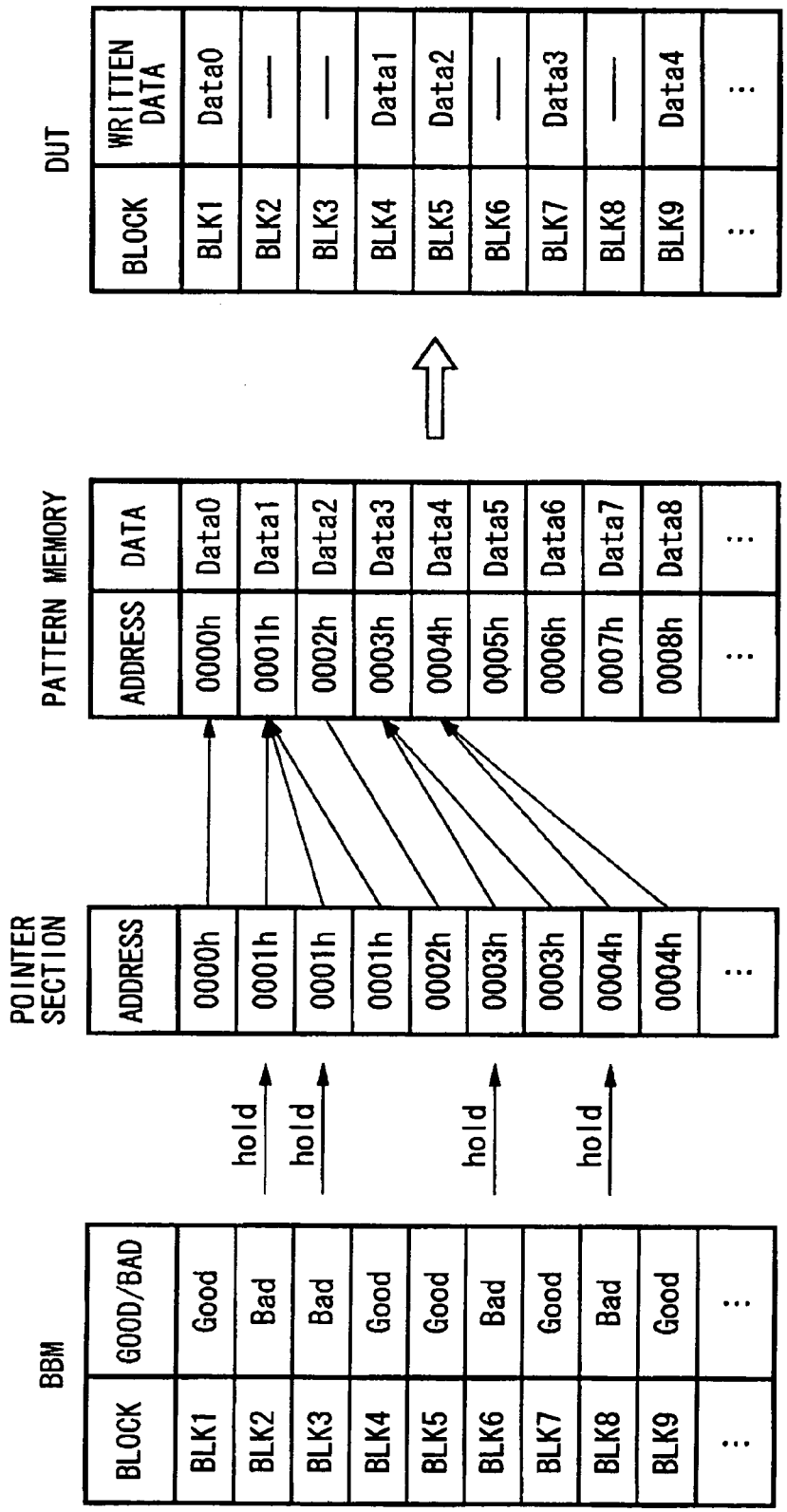
FIG. 2 is a set of tables showing one exemplary operation of the test apparatus 100.

FIG. 2 is a set of tables showing one exemplary operation of the test apparatus 100. In this example, the operation in writing the shipping data into the memory-under-test 200 will be explained. The bad block memory 24 stores information indicating whether or not each data block of the memory-under-test 200 is defect-free as explained in FIG. 1.

The BBM address selecting section 22 causes the bad block memory 24 to output good/bad information of a data block corresponding to the address of the memory-under-test 200 outputted out of the ALPG 10 to the pointer control section 26. When the data block corresponding to the address is a bad block, the pointer control section 26 inhibits the pointer section 28 from incrementing the address. That is, when the data block corresponding to the address is a bad block, the pattern memory 32 outputs same data until when a next address is inputted to the memory-under-test 200. Each data of the test pattern stored in the pattern memory 32 is sequentially written into the defect-free data block in the memory-under-test 200 through such operation.

Figure 3:
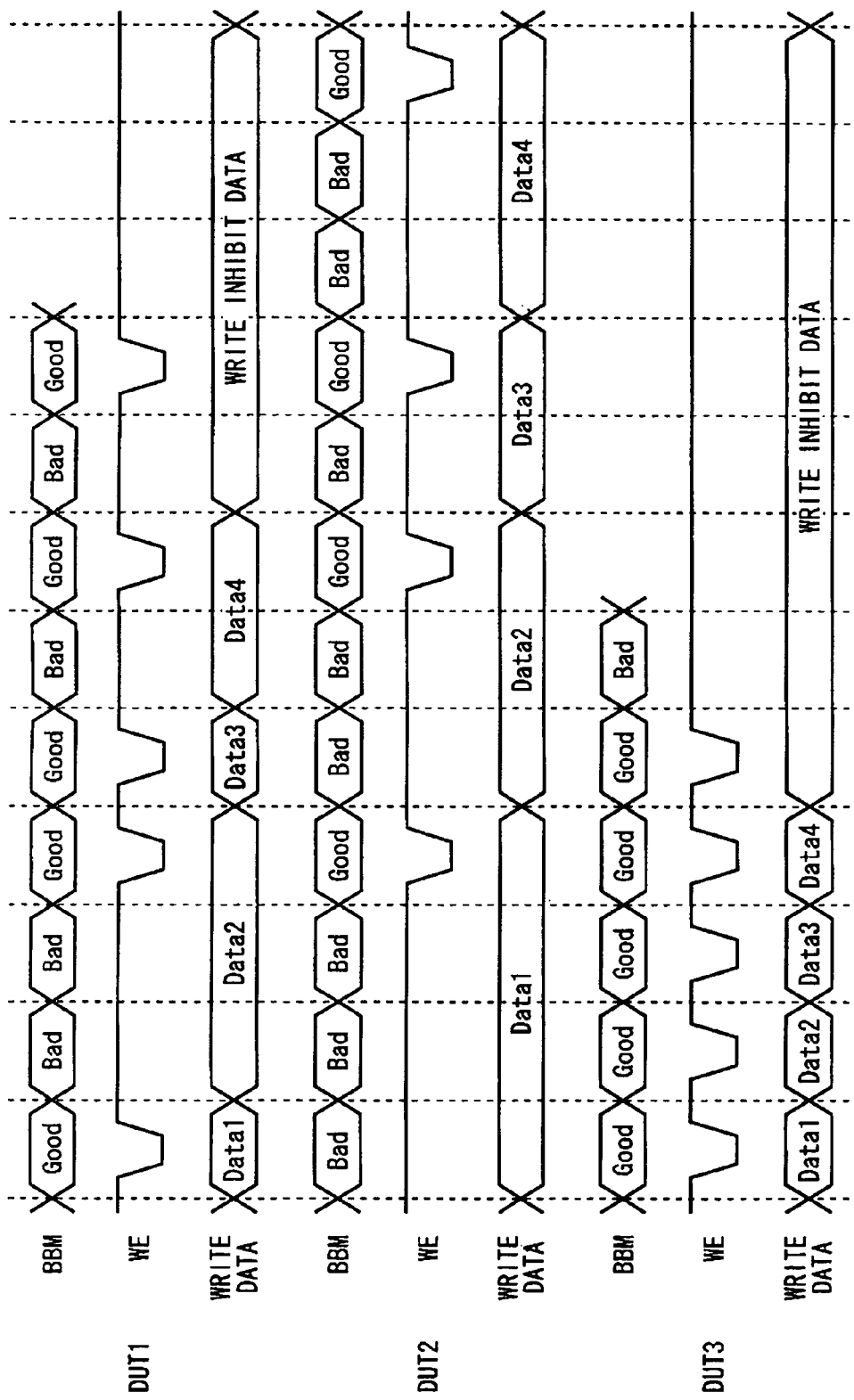
FIG. 3 is a timing chart showing one exemplary operation of each test board 20.

FIG. 3 is a timing chart showing one exemplary operation of each test board 20. In this example, the operation of writing the same shipping data (Data1 through Data4) into a plurality of memories-under-test 200 (DUT1 through DUT3) will be explained. In FIG. 3, dotted lines represent periods during which the ALPG 10 generates the address of the memory-under-test 200. That is, the ALPG 10 generates different addresses of the memory-under-test 200 during each period represented by the dotted line.

The operation of each test board corresponding to the DUT1 through DUT3 is carried out as explained in connection with FIGS. 1 and 2. That is, each test board 20 writes data by skipping bad blocks in the memory-under-test 200 and by selecting defect-free data blocks. 'BBM' in FIG. 3 represents good/bad information stored in each bad block memory 24 for a data block corresponding to an address generated by the ALPG 10 in each period. 'WE' represents the write enable signal supplied from the driver 42 to the memory-under-test 200 and 'Write Data' represents data written by the driver 38 into the memory-under-test 200.

The pointer control section 26 corresponding to each memory-under-test 200 controls the write enable signal outputted out of the waveform forming circuit 40 and the address of the pattern memory 32 outputted out of the pointer section 28 independently per memory-under-test 200 corresponding to whether or not the address of the memory-under-test 200 given from the ALPG 10 in each period is the address of the bad block memory of the corresponding memory-under-test 200.

For example, when addresses of the memory-under-test 200 corresponding to first, fourth, fifth, seventh and ninth periods are not addresses of bad blocks in the DUT1 for example, the pointer control section 26 corresponding to the DUT1 causes the driver 42 to output the write enable signal in each of those periods. Still more, the pointer control section 26 causes the pointer section 28 to output a next address in a period next to each of those periods. The data (Data1 through Data4) to be written into the memory-under-test 200 are written into the memory-under-test 200 in each period through such operation. Since all of the data is written into the memory-under-test 200 by the seventh period in this example, write inhibit data is inputted to the memory-under-test 200 on and after the eighth period. The write inhibit data is data representing an initial value of each cell of the memory-under-test 200 and is data fixed at level H for example. The write inhibit data is stored in the pattern memory 32 in succession to data to be written.

In the DUT3 for example however, addresses of the memory-under-test 200 corresponding to the first through fifth periods are not those of bad blocks. In this case, all of the data is written into the memory-under-test 200 by the fourth period for the DUT3. Therefore, the write inhibit data is inputted to the memory-under-test 200 on and after the fifth period.

It is thus possible to simultaneously test the plurality of memories-under-test 200 whose addresses where bad blocks exist differ by storing information on bad blocks of the memory-under-test 200 respectively in the bad block memory 24 of the corresponding test pattern 20. That is, it is possible to simultaneously write the same data into the plurality of memories-under-test 200 whose addresses where the bad blocks exist differ by independently controlling the input timing of each data corresponding to the bad block information of the corresponding memory-under-test 200 in each test board 20 for the plurality of memories-under-test 200. It allows the efficiency of the test to be improved.

Figure 4:
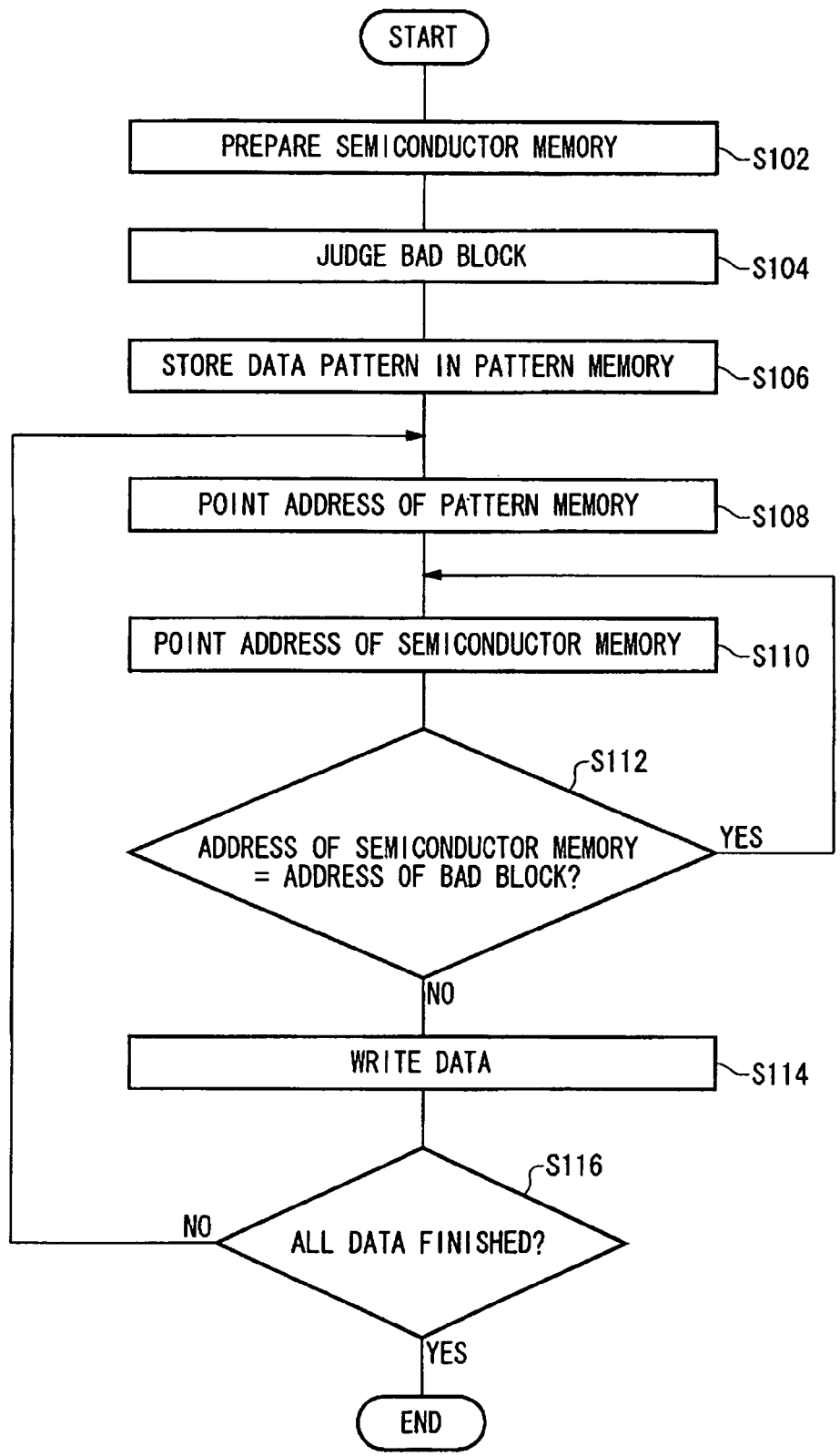
FIG. 4 is a flowchart showing one exemplary manufacturing method for manufacturing a semiconductor memory into which a predetermined data pattern has been written.

FIG. 4 is a flowchart showing one exemplary manufacturing method for manufacturing a semiconductor memory into which a predetermined data pattern is written. The manufacturing method of this example is used to manufacture the semiconductor memory in which the predetermined data pattern is written by using the test apparatus explained in FIGS. 1 through 3.

The semiconductor memory is prepared in a preparation step S102 at first. For example, a data storage type flash memory is prepared as the semiconductor memory. Next, unusable bad blocks are judged out of the storage area of the semiconductor memory in a judging step S104. The judging step S104 may be carried out by using the judging section 44 explained in connection with FIG. 1. The address of the bad block judged in the judging step S104 is stored in the bad block memory 24.

Next, the predetermined data pattern is written into an area other than those of the bad blocks in the storage area of the semiconductor memory in writing steps S106 through S116. At first, the data pattern is stored in the pattern memory 32 in a pattern preparing step S106. Next, an address for sequentially pointing each address of the pattern memory 32 is generated and is inputted to the pattern memory 32 in a pointer step S108. The pointer step S108 may be carried out by using the pointer section 28 explained in connection with FIG. 1.

Next, an address of the semiconductor memory into which the data pattern is written is sequentially generated in an address generating step S110. The address generating step S110 may be carried out by using the ALPG 10 explained in connection with FIG. 1. The address of the semiconductor memory is generated in synchronism with the address of the pattern memory in Steps S108 and S110.

Next, it is judged whether or not the address of the semiconductor memory generated in the address generating step S110 coincides with any one of the addresses of the bad block in Step S112. When the address of the semiconductor memory coincides with the address of the bad block, the address of the semiconductor memory outputted in the address generating step S110 is changed to a next address while holding the address of the pattern memory 32 outputted in the pointer step S108. When the address of the semiconductor memory does not coincide with the address of the bad block, data outputted out of the pattern memory 32 is written into the address of the semiconductor memory in Step S114.

Next, it is judged whether or not all of the data to be written into the semiconductor memory has been written in Step S114. When writing of all data has not been finished, the processes in Step S108 through S116 are repeated. The manufacturing of the semiconductor memory ends when writing of all data has been finished.

Such manufacturing method allows all of the predetermined data patterns to be written even to the semiconductor memory having bad blocks. Therefore, it is not necessary to select a semiconductor memory having no bad block in advance and hence the production yield may be improved.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

As it is apparent from the explanation described above, the present invention allows all of the predetermined data patterns to be efficiently written even into the memory having bad blocks. Therefore, it is not necessary to select a memory having no bad block in advance and hence the yield of the test of the memory-under-test or the yield of manufacturing thereof may be improved.

What is claimed is:

1. A test apparatus for testing a memory-under-test, comprising:
    an address control apparatus comprising:
        a pattern memory for storing data patterns to be inputted to said memory-under-test;
        an address generating section for outputting sequential addresses of said memory-under-test into which said data patterns are written;
        a pointer section for pointing to sequential addresses of said pattern memory to cause said pattern memory to output said data patterns corresponding to the addresses of said memory-under-test outputted by said address generating section;
        a bad block memory for storing quality information for data blocks of a storage area of said memory-under-test, said data blocks corresponding to said addresses of said memory-under-test; and
        a pointer control section for, when a data block corresponding to the address of said memory-under-test generated by said address generating section is indicated as a bad block based on the quality information stored in said bad block memory, causing said address generating section to output a next sequential address of said memory-under-test while holding the address of said pattern memory to which said pointer section points, the holding being performed by inhibiting said pointer section from incrementing the address of said pattern memory;
    a pattern generating section for generating test patterns;
    a data selecting section for selecting either said test patterns generated by said pattern generating section or said data patterns outputted by said pattern memory to input to said memory-under-test; and a judging section for reading data written in each address of said memory-under-test to judge whether a block corresponding to the address is good or bad based on the read data, wherein said address generating section further generates random addresses of said pattern memory, said pointer section generates sequential addresses of said pattern memory, and said test apparatus further includes a pattern memory address selecting section for selecting either said random addresses generated by said address generating section or said sequential addresses generated by said pointer section to input to said pattern memory.

2. The test apparatus as set forth in claim 1, wherein said pattern memory stores data patterns used in a device for mounting said memory-under-test.

3. The test apparatus as set forth in claim 1, wherein said test apparatus tests a plurality of memories-under-test in parallel and has a plurality of pattern memories, a plurality of pointer sections, a plurality of bad block memories and a plurality of pointer control sections corresponding to said plurality of memories-under-test, said address generating section generates addresses common to said memories-under-test, each one of said bad block memories stores quality information for data blocks of said corresponding memory-under-test, and each one of said pointer control sections controls said corresponding pointer section independently from each other based on said quality information stored in said corresponding bad block memory.

4. The test apparatus as set forth in claim 1, wherein said bad block memory stores the addresses of blocks judged to be bad by said judging section when said data selecting section selects said test patterns generated by said pattern generating section, and said data selecting section selects said data patterns outputted by said pattern memory after said bad block memory stores the addresses of said bad blocks.

* * * * *